Figure 1:
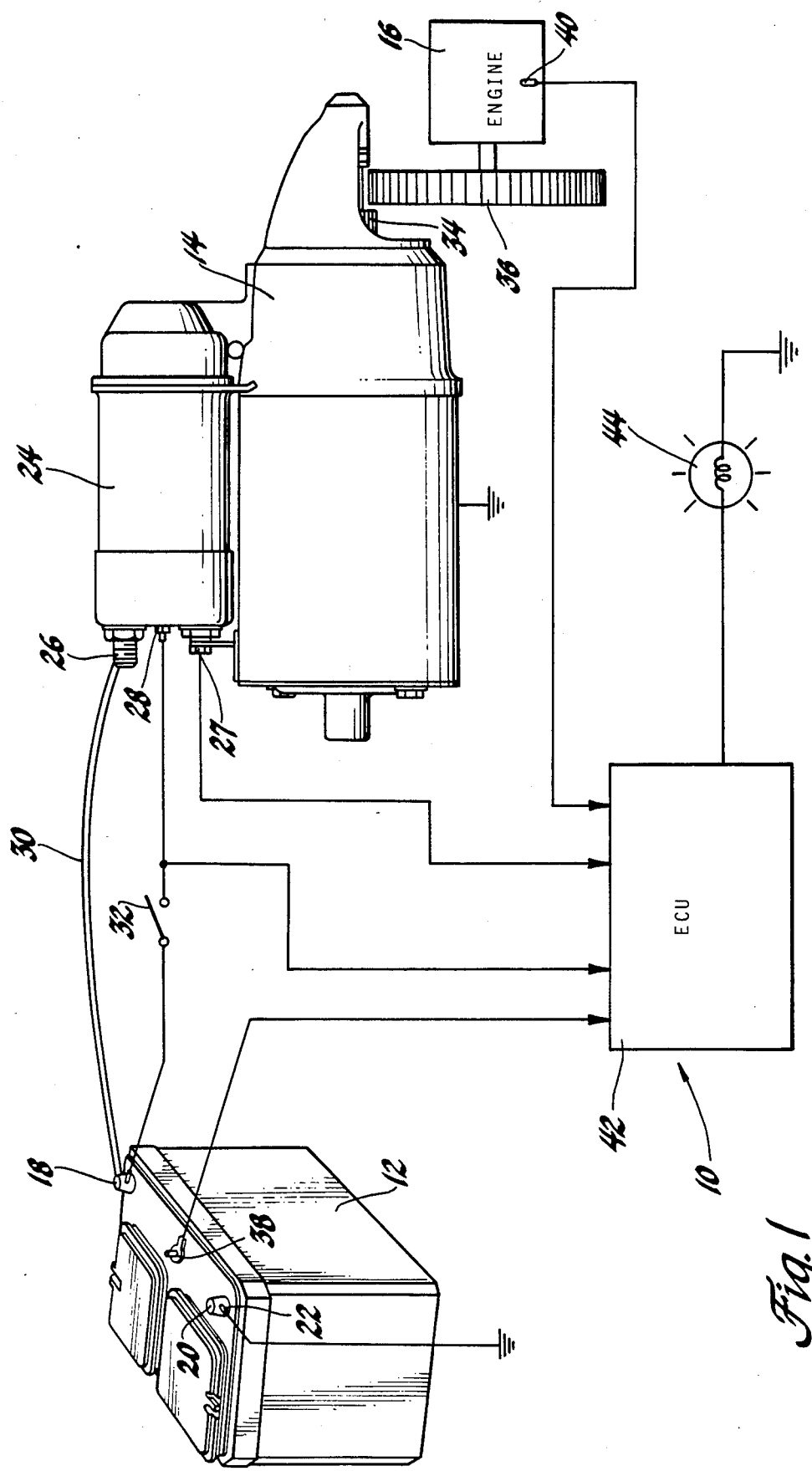

United States Patent [19]

Nowakowski et al.

[11] Patent Number: 4,731,601

[45] Date of Patent: Mar. 15, 1988

[54] CRANKING SYSTEM PERFORMANCE INDICATOR

[75] Inventors: Robert J. Nowakowski, Indianapolis; Van V. Reisberg, Jr., Anderson; Robert P. MacKenzie, Muncie, all of Ind.

[73] Assignee: General Motors Corporation, Detroit, Mich.

[21] Appl. No.: 939,413

[22] Filed: Dec. 8, 1986

[51] Int. Cl.$^4$ .................... B60Q 1/00; G01M 19/00
[52] U.S. Cl. ................................. 340/52 R; 73/118.1
[58] Field of Search .............. 73/118.1; 324/431, 433, 324/435, 426; 340/52 R, 519, 514, 635, 636; 307/10 BP; 364/481, 483

[56] References Cited

U.S. PATENT DOCUMENTS

| | | | |
|---|---|---|---|
| 2,446,039 | 7/1948 | Bennett | 73/118.1 |
| 2,991,413 | 7/1961 | Taylor | 324/435 |
| 3,876,931 | 4/1975 | Godshalk | 324/431 |
| 4,028,616 | 6/1977 | Stevens | 324/333 |
| 4,193,026 | 3/1980 | Finger et al. | 324/428 |
| 4,290,109 | 9/1981 | Taniguchi et al. | 324/433 |
| 4,423,378 | 12/1983 | Marino et al. | 324/427 |
| 4,488,521 | 12/1984 | Miller et al. | 340/636 |
| 4,493,001 | 1/1985 | Sheldrake | 340/636 |
| 4,521,735 | 6/1985 | Kageyama et al. | 324/433 |

FOREIGN PATENT DOCUMENTS 0840986 6/1981 U.S.S.R. .................. 340/635

Primary Examiner—Stewart J. Levy
Assistant Examiner—Robert R. Raesis
Attorney, Agent, or Firm—David L. Ahlersmeyer

[57] ABSTRACT

An apparatus for and method of testing the condition of a motor vehicle cranking system is disclosed in which the voltage at the battery terminal of the cranking motor is measured at one second intervals during cranking and compared to a set of predetermined minimum values stored in a computer lookup table according to the battery temperature and engine temperature during cranking. If a measured voltage is below a corresponding minimum voltage value, an indication is provided to the operator. The predetermined set of minimum values for each combination of measured battery and engine temperatures corresponds to the minimum voltages that would be provided at the measured temperatures by a cranking system capable of providing at least the minimum voltages down to and including the lowest design temperature.

5 Claims, 2 Drawing Figures

CRANKING SYSTEM PERFORMANCE INDICATOR

This invention relates to a cranking system of an internal combustion engine wherein the condition of the cranking system is tested during cranking to indicate whether the cranking system will perform adequately at and above a predetermined minimum operating temperature.

More particularly, the present invention is applicable to a motor vehicle cranking system including a storage battery, an electric cranking motor, and an internal combustion engine using a lubricant the viscosity of which varies generally with the temperature thereof.

In such a system, the capacity of the battery varies with battery temperature and discharge current, and the mechanical load of the engine varies with engine temperature. Specifically, the capacity of the battery decreases as the battery temperature decreases and the discharge current increases, while the mechanical load of the engine increases as the engine temperature decreases. The increased mechanical load of the engine results in increased current being required by the cranking motor from the battery during engine cranking. Therefore, with decreasing battery and engine temperatures, the battery capacity is diminished due to both decreased battery temperature and increased discharge current. Consequently, there is a minimum operating temperature below which the battery has insufficient capacity to deliver to the cranking motor, for a specified time period, the power required to crank the engine at a sufficient speed for starting. Accordingly, the components of a cranking system, particularly the battery, are initially chosen so as to insure adequate engine cranking for starting at temperatures down to and including a predetermined minimum operating temperature.

In addition to being dependent upon temperature and discharge current, the capacity of a battery tends to decrease over time as the battery is cycled. This decrease in battery capacity may result in a condition whereat the battery has adequate capacity for cranking at higher temperatures but does not have adequate capacity for cranking at lower temperatures. This degradation of battery capacity over time poses a problem in that the vehicle operator does not know if the cranking system will effectively operate when the temperature decreases toward the predetermined minimum operating temperature. It is desirable, therefore, to provide a method of and apparatus for predicting an impending under-capacity condition at lower operating temperatures while the cranking system is still performing adequately at higher temperatures.

It is conventional to determine the capacity of a battery by performing a load test, whereby the battery is connected to a static load, i.e., a carbon pile resistive element, and discharged at a known current rate. However, this procedure is inconvenient and involves the use of battery power engaged in nonproductive work. Another type of test used in electric vehicles having traction motors involves monitoring the battery voltage and the load current during operation and looking for a relationship between the two that would indicate decreasing battery capacity. The primary disadvantage of such a system is that a shunt is needed to measure the load current.

It has been found that for a given combination of cranking motor, engine, and engine oil, the current required by the cranking motor to crank the engine increases predictably with decreasing engine temperature due to the increase in the engine load on the cranking motor. Furthermore, the cranking motor and engine combination behaves at any given temperature as a relative constant current load with the result that the variations in the voltage applied to the cranking motor do not significantly affect the motor current. However, such variations in voltage have been found to affect the cranking motor speed. Specifically, the cranking motor speed increases with increasing voltage applied to the motor.

In accord with this invention, at a predetermined minimum operating temperature, the cranking motor current and voltage required to crank the engine at a predetermined speed for starting is determined experimentally. For a given cranking system, the current is a function of the predetermined minimum operating temperature while the voltage is related to the minimum cranking speed required to start the engine. A battery just capable of providing this power, i.e., cranking motor current and voltage, at the predetermined minimum operating temperature will exhibit, as will any other battery, increased capacity at higher battery and engine temperatures. This increase in capacity is a function of the higher battery temperature and the lower discharge current required by the cranking motor at higher engine temperatures. Since the cranking motor current and engine temperature relationship is a constant, the battery voltage at any particular temperature is a measure of battery capacity. These known relationships permit the cranking motor voltage at various combinations of engine and battery temperatures to be determined experimentally for a battery just capable of providing the required power at the predetermined minimum operating temperature. The resulting schedule of voltage values is a temperature compensated measure of the minimum required battery capacity for that particular cranking system. Furthermore, because the current required by the cranking motor at any given engine temperature is constant, any degradation of battery capacity resulting in the delivery of less power will manifest itself in decreased cranking motor voltage below the above mentioned experimentally determined values.

Pursuant to this invention, a dynamic test is performed on the cranking system during routine cranking based on the requirement of a minimum battery capacity for effective cranking at the predetermined minimum operating temperature. During cranking at measured test values of battery temperature and engine temperature, cranking motor voltage is measured and motor current is known based upon engine temperature. The measured motor voltage, representing battery capacity at the test temperatures, is compared to a stored voltage value in a schedule of values determined as described above representing the temperature compensated minimum required battery capacity at the predetermined minimum operating temperature. Also, pursuant to the invention, a set of voltage values representing minimum values for each second over a five second test period can be provided to account for decreasing battery capacity over discharge time, thereby testing cranking capacity of the cranking system at the minimum operating temperature over five seconds of engine cranking.

Figure 2:
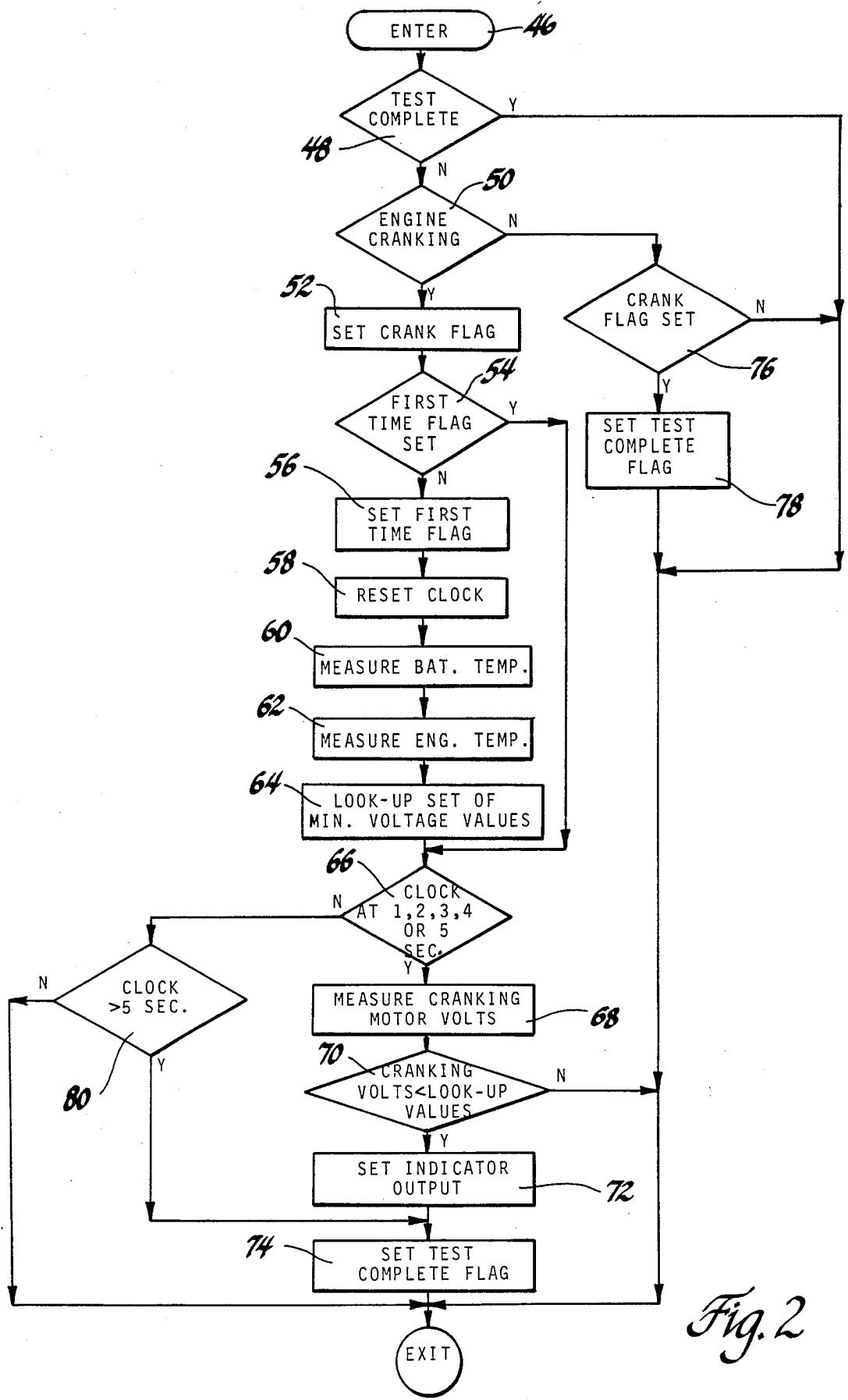

The invention is further described below, as to a specific embodiment, in conjunction with the following drawings:

FIG. 1 is a diagrammatic representation of an engine cranking system that incorporates the principles of the present invention; and FIG. 2 is a diagram illustrative of the operation of the system of FIG. 1.

Referring now to FIG. 1, there is depicted a cranking system 10 of the type to which the present invention is applicable. The system 10 includes a storage battery 12 for providing electrical power to a cranking motor 14 that, in turn, cranks an internal combustion engine 16 during starting thereof. The battery 12 includes a positive terminal 18 and a grounded negative terminal 20. The cranking motor 14 incorporates a solenoid switch 24 to provide low current switching of the high current cranking motor load and engagement of the cranking motor 14 with the engine 16 upon switch actuation. The solenoid switch 24 includes a solenoid battery terminal 26, a motor terminal 27 connected to the motor windings, and a switch terminal 28. A heavy conductor 30 is connected between the positive terminal 18 and the motor battery terminal 26. A starting switch 32 is capable, upon closing, of providing voltage from the positive terminal 18 to the switch terminal 28.

In the usual manner, when the starting switch 32 is closed, voltage is applied to the switch terminal 28 of the solenoid switch 24. In turn, the solenoid switch 24 is actuated, thereby allowing voltage at the motor battery terminal 26 to be applied to the motor terminal 27 and causing engagement of the starting motor pinion gear 34 with the engine ring gear 36 and cranking of the engine 16 for starting purposes. Cranking continues so long as the starting switch 32 is closed.

The cranking system 10 of FIG. 1 must be able to crank the engine at a minimum speed required for starting as determined experimentally for each engine. The electrical power required to crank the engine at the minimum starting speed varies with the temperature of the engine. Specifically, the mechanical load of the engine increases with decreasing engine temperature as a result of changes in engine oil viscosity. The increased mechanical load of the engine requires greater cranking motor current for cranking. Further, the capacity of the battery decreases as the temperature decreases and the discharge current increases.

For a given engine temperature, the cranking motor current remains relatively constant due to counterelectromotive forces developed in the cranking motor, despite any changes in the voltage supplied to the cranking motor. However, increases in voltage supplied to the motor cause increased power to be delivered to the cranking motor, resulting in increased cranking speeds.

The capacity requirement of the battery can further be quantified in terms of its ability to deliver a specified amount of current during a certain discharge time while maintaining a minimum voltage. In a cranking system application, for example, the capacity of the battery must be sufficient to deliver the required motor current during a predetermined time period of cranking at the voltage necessary to achieve the minimum cranking speed. While various time periods may be selected in this embodiment, the predetermined time period is five seconds.

From the foregoing, it is apparent that there is a minimum cranking motor voltage required for the predetermined time period to establish the minimum cranking speed at the lowest anticipated temperature conditions of the engine and battery.

For purposes of illustration, but without any limitation upon the invention, a predetermined minimum operating temperature for the cranking system of −20 degrees Fahrenheit is selected for the system 10 of FIG. 1. At this predetermined engine temperature, the required cranking motor voltage for cranking the engine at the minimum starting speed is determined. The determined voltage value represents the power requirement of the system at the predetermined minimum operating temperature. Therefore, a storage battery having the capacity to provide this minimum voltage to the cranking motor for the predetermined time period at this temperature must be selected for the cranking system.

Because the battery capacity increases with increasing temperature and the current required by the cranking motor to crank the engine decreases with increasing temperatures, it follows that if the battery capacity is adequate at the minimum temperature condition, then it will be adequate for effective operation at temperatures above the minimum condition.

In practicing the principles of the present invention, the capacity of the battery 12 of the system 10 is tested during operation of the cranking system 10 at battery and engine temperatures other than the predetermined minimum temperature. Since, as previously described, the motor current and engine temperature relationship is a constant independent of motor voltage, the motor voltage alone indicates the capacity of the cranking of the system for a given engine temperature. Therefore, during cranking, the motor voltage is measured and compared to a stored voltage value representing the required battery capacity at a minimum operating temperature compensated for known variations of battery capacity due to battery temperature and discharge rate. Voltage values are stored according to battery temperature and engine temperature (indicating discharge rate) so that the proper values are used for comparison based upon the measured battery and engine temperature at the time of the cranking test.

The present invention tests the capacity of the cranking system 10, i.e., the capacity of the battery 12 determined at the motor terminal 27, each time the cranking system is operated. It should be appreciated that by determining the capacity of the battery 12 at the motor terminal 27, any high resistance connections or properties of the conductor 30 or solenoid switch 24 will be considered automatically in testing for adequate battery capacity. This allows for not only a test of the battery 12, but of the cranking system up to the motor terminal 27 as well.

In the illustrated embodiment of the invention in FIG. 1, a battery temperature sensor 38 is incorporated into the battery 12 and an engine temperature sensor 40 is incorporated into the engine 16. For purposes of illustration, but without any limitation upon the invention, a sealed thermocouple extending into the battery electrolyte may be used for the battery temperature sensor 38 and a conventional engine coolant temperature sensor may be used for the engine temperature sensor 40. In order to perform the test of the present invention, an electronic control unit (ECU) 42 receives analog input signals from the battery temperature sensor 38, the engine temperature sensor, and the motor terminal 27. In addition, an input voltage signal from the switch terminal 28 is received by the ECU 42. The ECU 42 provides an output signal to an indicator 44 which, for example, may be an incandescent, dash-mounted indicator light.

In the illustrated embodiment of the invention, ECU 42 takes the form of a digital computer. The digital computer is standard in form and includes a microprocessing unit (MPU) which executes an operating program permanently stored in a read only memory (ROM) that also stores tables of voltage values utilized for comparing with the voltages measured at motor terminal 27 during the cranking system test. Contained within the MPU are conventional counters, registers, accumulators, and flag flip flops. The MPU receives inputs from a two-phase clock and generates the required timing signals for the remainder of the computer system. The MPU further receives an input from a restart circuit which generates a signal for initiating the remaining components of the computer system upon startup of the vehicle such as by operation of the standard vehicle ignition switch.

The digital computer also includes a random access memory (RAM) into which data may be temporarily stored and from which data may be read at various address locations as determined in accord with the programs stored in the ROM. A power control unit (PCU) receives voltage from the vehicle battery through the vehicle ignition switch and provides regulated power to the various operating circuits in the ECU 42.

The digital computer further includes an analog to digital converter (ADC). The ADC receives a plurality of vehicle and engine parameter inputs including those from the battery temperature sensor 38, the engine temperature sensor 40, and the motor terminal 27. The signals applied to the ADC are each sampled and converted under control of the MPU and stored in ROM designated RAM memory locations.

When power is first applied to the ECU 42 such as by operation of the standard vehicle ignition switch, a restart signal from a restart circuit provides initialization of the digital computer of ECU 42. During this initialization, initial values stored in the ROM are entered into ROM designated locations in the RAM and counters, flags, and times are initialized. Thereafter, the program proceeds to execute the operating program stored in the ROM to control performance of the cranking system test.

A closed-loop cranking performance test routine that is repeated at timed intervals is generally illustrated in FIG. 2. Referring to FIG. 2, the cranking performance test routine is entered at point 46 and proceeds to a step 48 where it determines whether the test has been completed by checking for a test complete flag. If the test is not complete, the program proceeds to a step 50 where it determines whether the engine is cranking. In one embodiment, the engine is considered to be cranking if voltage is present at the switch terminal 28. If the engine is cranking, the program proceeds to step 52 and sets a crank flag.

Next, the program proceeds to a step 54 where it determines whether the test routine is being performed for the first time. If so, the program proceeds to a step 56 where a first time flag is set. At a step 58, a clock measuring the elapsed time of performance of the cranking system performance test is reset. The program proceeds to steps 60 and 62 where the present values of the battery temperature and engine temperature are accessed from RAM, respectively.

Next at step 64, the program determines an appropriate set of five voltage values based upon the measured battery temperature and engine temperatures in steps 60 and 62, respectively. For purposes of illustration, but without any limitation upon the invention, the sets of voltage values are stored in a three dimensional table according to temperature ranges for battery and engine temperatures. It should be appreciated that the narrower the temperature ranges are, the greater is the resolution of the test. The five voltage values correspond to minimum values for the motor terminal voltage at one second intervals during the cranking system test. Specifically, each of the five voltage values is associated with a particular sample time at which the motor terminal voltage will be measured, and represents the minimum acceptable motor terminal voltage at that particular sample time.

In the embodiment of FIG. 1, the lookup table of voltage values is established for a specific engine and cranking motor combination, including engine oil having the manufacturer's recommended viscosity, where the minimum cranking speed to start the engine has been established experimentally. In trial and error fashion, successive tests are performed on the cranking system using new batteries of varied design capacities at the predetermined minimum operating temperature of −20 degrees Fahrenheit to identify a battery having the minimum battery capacity necessary to crank the engine at the minimum cranking speed for five seconds. The new batteries are tested at approximately 80% state-of-charge because that is the level of battery charge a vehicle charging system is typically able to maintain.

After the battery design possessing the minimum required capacity for the cranking system is determined, further tests are performed with batteries of that design to obtain the table of voltage values stored in the lookup table. While tests could be performed with the actual cranking system at various temperatures, the known relationship between cranking motor current and engine temperature allows simulation of the cranking motor/engine load on the battery. Specifically, for each possible combination of battery temperature range and engine temperature range, five batteries are discharged for five seconds at a battery temperature equal to the midpoint of the lookup table range and at a discharge current corresponding to the cranking motor current at an engine temperature equal to the midpoint of the lookup table range. The voltage of the five batteries is measured at one second intervals up to five seconds. Based upon the five different battery measurements at each one second interval, a value equal to the statistical minus three sigma point, i.e. three standard deviations below the mean, is determined for each one second interval. To each of these values, an appropriate value representing an acceptable voltage drop from the positive terminal 18 to the motor terminal 27 is subtracted. The resultant voltage values are stored in ROM as the minimum voltage values to be compared with measured values. Each stored voltage value is a temperature compensated measure of the minimum required battery capacity to provide engine cranking at the desired speed at the lowest engine and battery temperature ranges.

Next at step 66 the program determines whether the clock that was reset in the step 58 has elapsed 1, 2, 3, 4 or 5 seconds of time. If the clock is at one of these five integer values the program proceeds to a step 68 where a value of the motor volts measured at the motor terminal 27 is accessed from RAM. Next, at step 70, the motor voltage value of step 68 is compared with the lookup value determined in step 64 that is associated with the sample time determined at step 66. If in step 70 the measured voltage is less than the look-up minimum voltage, the program proceeds to a step 72 where the output to the indicator light is set, thereby indicating to the vehicle operator a need to check the cranking system. Once the indicator output is set, the program next proceeds to a step 74 where the test complete flag is set.

Returning to step 48, if the test complete flag were set indicating that the test was complete, the program would proceed to exit the cranking system test routine.

Returning to step 50, if the engine is not cranking, the program proceeds to a step 76, where it is determined whether the crank flag is set. If it is, the program proceeds to a step 78 and sets the test complete flag before proceeding to exit from the cranking system test routine. If the crank flag is not set at step 76, the program proceeds to exit from the test routine. Steps 76 and 78 are necessary to establish whether a non-cranking condition represents the end of cranking or execution of the test routine prior to cranking.

Returning to step 66, if the clock is not at one of the prescribed integer second values, a step 80 determines whether the timer is beyond the five second point. If the timer is beyond the five second point, the program proceeds to step 74 where the test complete flag is set before the program proceeds to exit from the cranking system test routine. If at step 80 the clock is not beyond five second, the program proceeds to exit the test routine without setting the test complete flag.

Returning to step 70, if the measured voltage is not less than the look-up minimum value, the program proceeds to exit from the cranking system test routine of FIG. 2 without setting the indicator output.

The preferred embodiment set forth in the foregoing steps provide for measurement and comparison of cranking motor voltage values associated with one second time intervals beginning at one second after cranking is initiated for illustration purposes only. Other time periods and intervals may be used. However, it is preferable to delay the time to the first measurement until the voltage transient resulting from the motor inductance when the battery is first coupled to the motor has decayed.

It will be appreciated that the foregoing description of a preferred embodiment of the invention is presented by way of illustration only (and not by way of any limitation) and that various alternatives and modifications may be made to the illustrated embodiment without departing from the spirit and scope of the invention.

The embodiments of the invention in which an exclusive property or privilege is claimed are defined as follows:

1. In a cranking system including an internal combustion engine requiring a minimum cranking speed for starting, a storage battery having a capacity that decreases with decreasing battery temperature and increasing current load on the battery, and an electric cranking motor drivingly engaged with the engine when current is supplied from the battery to the cranking motor, the current required by the cranking motor to crank the engine increasing with decreasing temperature of the engine, and further including a predetermined low limit operating condition corresponding to a minimum battery and engine temperature at which it is desired that the cranking system be capable of achieving the minimum cranking speed, a method of testing the cranking system during engine cranking, comprising the steps of:
   a. storing a schedule of minimum battery voltage values as a function of battery temperature and engine temperature values, the stored value at each combination of engine and battery temperature values representing the minimum capacity of the battery required to achieve the minimum cranking speed at the predetermined low limit operating condition;
   b. measuring the temperature of the engine;
   c. measuring the temperature of the battery;
   d. measuring the voltage of the battery during cranking of the engine;
   e. comparing the measured voltage of the battery with the voltage value in the stored schedule corresponding to the measured battery and engine temperatures; and
   f. indicating the condition of the cranking system based upon the comparing step, whereby the indication represents a forewarning of an impending failure of the cranking system to achieve the minimum cranking speed at the predetermined low limit operating condition.

2. In a cranking system including: an internal combustion engine requiring a minimum cranking speed for starting; a storage battery having a capacity that decreases with decreasing battery temperature and increasing current load on the battery; an electric cranking motor drivingly engaged with the engine when current is supplied from the battery to the cranking motor, the current required by the cranking motor to crank the engine increasing with decreasing temperature of the engine; a predetermined low limit operating condition corresponding to a minimum battery and engine temperature at which it is desired that the cranking system be capable of achieving the minimum cranking speed; and a predetermined maximum elapsed time interval for cranking the engine at the end of which it is desired that the cranking system be capable of achieving the minimum cranking speed, a method of testing the cranking system during engine cranking, comprising the steps of:
   a. storing a schedule of sets of minimum battery voltage values as a function of battery temperature and engine temperature values, the stored set of voltage values at each combination of engine and battery temperature values representing the minimum capacity of the battery required at predetermined sample times during the elapsed time interval to achieve the minimum cranking speed at the end of the elapsed time interval at the low limit operating condition;
   b. measuring the temperature of the engine;
   c. measuring the temperature of the battery;
   d. measuring the voltage of the battery during cranking of the engine at each of the predetermined sample times;
   e. comparing the measured voltage of the battery at each of the sample times with the corresponding voltage value from the set of minimum voltage values in the stored schedule corresponding to the measured battery and engine temperatures; and
   f. indicating the condition of the cranking system based upon the comparing step, whereby the indication represents a forewarning of an impending failure of the cranking system to achieve the minimum cranking speed at the predetermined low limit operating condition.

3. A performance indicator for a cranking system including an internal combustion engine requiring a minimum cranking speed for starting, a storage battery having a capacity that decreases with decreasing battery temperature and increasing current load on the battery, and an electric cranking motor drivingly engaged with the engine when current is supplied from the battery to an input terminal on the cranking motor through a conducting cable and a switch, the current required by the cranking motor to crank the engine increasing with decreasing temperature of the engine, the cranking system further including a predetermined low limit operating condition corresponding to a minimum battery and engine temperature at which it is desired that the cranking system be capable of achieving the minimum cranking speed, comprising:

means for storing a schedule of minimum input terminal voltage values as a function of battery temperature and engine temperature values, the stored value at each combination of engine and battery temperature values representing the minimum input terminal voltage produced in a cranking system capable of providing the minimum power required by the cranking motor to achieve the minimum cranking speed at the predetermined low limit operating condition;

means for measuring the temperature of the engine;

means for measuring the temperature of the battery;

means for measuring the voltage at the input terminal of the cranking motor during cranking of the engine;

means for comparing the measured voltage at the input terminal with the stored minimum input terminal voltage value corresponding to the measured engine temperature and the measured battery temperature to determine whether the measured voltage is less than the minimum input terminal voltage value; and means, responsive to the means for comparing, for indicating the condition of the cranking system, whereby the engine cranking system is tested during engine cranking to predict whether the cranking system will perform at the predetermined low limit operating condition and at temperatures greater than those corresponding to the predetermined low limit operating condition.

4. A performance indicator for a cranking system including: an internal combustion engine requiring a minimum cranking speed for starting; a storage battery having a capacity that decreases with decreasing battery temperature and increasing current load on the battery; an electric cranking motor drivingly engaged with the engine when current is supplied from the battery to the cranking motor, the current required by the cranking motor to crank the engine increasing with decreasing temperature of the engine; a predetermined low limit operating condition corresponding to a minimum battery and engine temperature at which it is desired that the cranking system be capable of achieving the minimum cranking speed; and a predetermined maximum elapsed time interval for cranking the engine at the end of which it is desired that the cranking system be capable of achieving the minimum cranking speed, comprising:

means for storing a schedule of sets of minimum battery voltage values as a function of battery temperature and engine temperature values, the stored set of voltage values at each combination of engine and battery temperature values representing the minimum capacity of the battery required at predetermined sample times during the elapsed time interval to achieve the minimum cranking speed at the end of the elapsed time interval at the low limit operating condition;

means for measuring the temperature of the engine;

means for measuring the temperature of the battery;

means for measuring the voltage of the battery during cranking of the engine at each of the predetermined sample times;

means for comparing the measured voltage of the battery at each of the sample times with the corresponding voltage value from the set of minimum voltage values in the stored schedule corresponding to the measured battery and engine temperatures to determine whether at least one of the measured voltages is less than the corresponding minimum voltage value; and means, responsive to the means for comparing, for indicating the condition of the cranking system, whereby the indication represents a forewarning of an impending failure of the cranking system to achieve the minimum cranking speed at the predetermined low limit operating condition.

5. In a motor vehicle cranking system having a storage battery for providing power to an input terminal of an electric cranking motor to crank an internal combustion engine during starting, in which the battery capacity decreases with decreasing battery temperature and increasing battery current, the battery current required to crank the engine increases with decreasing engine temperatures, and the engine requires a minimum cranking speed for starting, a cranking system performance indicator for testing during engine cranking whether the cranking system can achieve the minimum cranking speed at a predetermined minimum operating condition corresponding to a minimum battery temperature and engine temperature, comprising:

means for storing a schedule of minimum input terminal voltage values as a function of battery temperature and engine temperature values, the stored value at each combination of engine and battery temperature values representing the input terminal voltage achieved experimentally by using a battery having a capacity no greater than is necessary to achieve the minimum cranking speed at the minimum operating condition;

means for measuring the engine temperature;

means for measuring the battery temperature;

means for measuring the input terminal voltage during cranking of the engine;

means for comparing the measured voltage of the battery with the voltage value in the stored schedule corresponding to the measured engine and battery temperatures and indicating that the measured voltage is less than the stored voltage value, whereby the driver of the motor vehicle is warned that the capacity of the vehicle battery is less than the capacity necessary to achieve the minimum cranking speed at the minimum operating condition.

* * * * *